United States Patent [19]

Putnam

[11] Patent Number: 5,055,969

[45] Date of Patent: Oct. 8, 1991

[54] SERVO/DATA ACTUATOR ARM FLEXIBLE CIRCUIT

[75] Inventor: John S. Putnam, Excelsior, Minn.

[73] Assignee: Seagate Technology, Inc., Scotts Valley, Calif.

[21] Appl. No.: 590,233

[22] Filed: Sep. 28, 1990

[51] Int. Cl.⁵ .................................. H05K 1/11
[52] U.S. Cl. ................... 361/398; 361/414; 360/103; 360/104
[58] Field of Search ............ 361/398, 414, 400, 404, 361/406, 409; 330/66; 360/103, 104

[56] References Cited

U.S. PATENT DOCUMENTS 4,402,025 8/1983 Anderson et al. ............... 360/98
4,973,799 11/1990 Soma et al. ................... 361/414 X Primary Examiner—Gerald P. Tolin
Assistant Examiner—Paramita Ghosh
Attorney, Agent, or Firm—Kinney & Lange

[57] ABSTRACT

An improved multilayer flexible circuit for use in a disk storage device actuator arm supporting a data head and a servo head includes a first ground plane and a second electrically floating ground plane.

17 Claims, 3 Drawing Sheets

SERVO/DATA ACTUATOR ARM FLEXIBLE CIRCUIT

BACKGROUND OF THE INVENTION

The present invention relates to disk drive systems. In particular, the invention relates to a shielded flexible circuit for an actuator arm that supports a magnetic data read/write head and a servo head of a hard disk storage device.

Designers of prior art hard disk storage devices have encountered difficulties in mounting a servo head and a data head on the same actuator arm. The signals going to the data head are believed to interfere with the servo signals from the servo head, which can cause inaccuracy in the positioning of the actuator arms and attached heads. Because of this interference, disk storage device designers typically have placed the servo surface on either of the outermost surfaces in the disk stack. With this servo surface placement, the servo head is mounted by itself on an outermost actuator arm, and no signal interference occurs.

Actuator arms and attached heads can sometimes become misaligned with the tracks. In disk storage devices having a servo surface positioned at either end, the actuator arms mounted farthest away from the servo surface are subject to greater alignment error than those mounted closer to the servo surface. A more complete discussion of this problem is found in Anderson et al. U.S. Pat. No. 4,402,025 at column 1.

Placement of the servo surface in the middle of the disk stack is known to reduce certain types of alignment error, but it magnifies other sources of error such as crosstalk and noise from the data heads, which disrupt the servo signal. The physical closeness of the data preamplifier conductors and the servo preamplifier conductors results in an unacceptable amount of crosstalk between the data signals and the servo signals. The data write signals are typically high current signals. In contrast, the servo signals are typically of a much lower current. The high current data write signals can interfere with the low current servo signals.

When the servo surface is placed in the middle of the disk stack, the data surface adjacent to the servo surface must either be accessed by mounting a data head on the same actuator arm as the servo head, or that data surface must be left unused. In order to maximize the capacity of a disk storage device, it is desirable to mount a servo head and a data head on the same actuator arm.

Designers of hard disk storage devices have attempted to achieve adequate disk storage device performance with servo heads and data read/write heads positioned on the same actuator arm by providing shielding in the circuitry of the actuator arm. For example, Anderson et al U.S. Pat. No. 4,402,025 discloses a multi-part magnetic shield in a magnetic disk drive head/actuator arm assembly for preventing interference between data signals and the position (servo) signals. The shield is positioned on the actuator arm between a magnetic read/write head and a servo head.

Anderson et al also discloses a multilayer flexible circuit for use in an actuator arm supporting both a servo head and a data read/write head. The servo and data circuitry are shielded by spacing the servo preamplifier apart from the read/write circuitry, and by placing shielding traces on either side of the servo traces as well as on either side of the read/write traces. A ground plane is positioned between the servo and data conductive traces.

Another magnetic shield known in the art is a foil conductor formed from aluminum which is attached to and completely covers the lower surface of a flexible circuit. On the upper surface is a servo preamplifier and a data preamplifier. The shield is attached to the flexible circuit with an adhesive.

There are several disadvantages in using magnetic shields. First, the magnetic shield requires another piece part and an additional assembly step or steps to install the shield.

Second, a magnetic shield is also undesirable because the shield and adhesive both add weight to the actuator arm, which increases its mass moment of inertia. Any increase in the mass moment of inertia of an actuator arm adversely affects disk drive performance. As the inertia increases, the structure cannot be accelerated as easily and therefore the actuator arm's response time increases. Power consumption of the disk drive also increases with an increase in the actuator arm inertia. The structural requirements of the actuator arm also must be increased to withstand the increased torsional forces.

Another technique for reducing noise and crosstalk from mounting a data head and a servo head on the same actuator arm is to use a conductive shield layer of a defined shape within a multilayer flexible circuit to shield certain portions of the circuitry. The shield layer interacts with various features of the circuit design to create a low noise environment.

Some known design features which minimize crosstalk and noise include separating the signal paths, routing the ground paths in a manner which reduces noise, and noise cancellation by shielding portions of custom hybrid circuits.

It is known to use a shield layer in a multilayer flexible circuit for use as part of a radio frequency (RF) circuit design for reducing noise and crosstalk on a servo/data flexible circuit. This prior art flexible circuit has a shield layer of a substantially L-shape, for shielding custom hybrid components having a particular shape, such that the data input and output pins to the data preamplifier and the servo input pins to the servo preamplifier are shielded. This prior art flexible circuit also shields a portion of the data lines which are electrically connected to the data input pins, data output pins, and servo input pins. The shield layer covers particular portions of the flexible circuit and relies on complex radio frequency interaction to create feedback having the desired noise cancellation effects.

There are several disadvantages in using the above-mentioned prior art flexible circuit. The circuit design requires custom hybrid parts, which typically are significantly more expensive than standard parts, and are less reliable. In order to adequately reduce noise, the prior art flexible circuit requires a metal outer layer. Metal layers are expensive to fabricate, are more difficult to clean, and add mass to the actuator arm.

SUMMARY OF THE INVENTION

The present invention is a flexible circuit for an actuator arm of a hard disk storage device. The actuator arm extends between a pair of disks of a disk stack and supports, at its outer end, a servo head for reading servo information from a servo surface of one disk and a data head for reading data from and writing data to a data surface of the other disk. The flexible circuit has a servo preamplifier, a data preamplifier, a signal routing layer which includes a first ground plane, and an electrically conductive second ground plane which is electrically isolated from and closely spaced to the signal routing layer.

The flexible circuit includes a flexible substrate which bends enough so that the actuator arm remains electrically connected to the servo controller and data read-/write circuitry when the actuator arm moves the heads from track to track on the disk surfaces. A servo preamplifier and a data preamplifier are mounted on the upper surface of the flexible substrate.

The flexible substrate is multilayered and is formed of a plurality of electrically insulating and conducting layers. The conducting layers include a signal routing layer with a first ground plane which underlies the data and servo preamplifiers and a second electrically floating ground plane layer. The flexible circuit has a main body portion and a tail portion. The preamplifiers are mounted onto an upper surface of the main body portion.

The signal routing layer contains a plurality of data lines which route data between the data head and the data preamplifier and between the data preamplifier and the tail portion. The conductive servo lines are also routed on the signal routing layer. The conductive servo lines route servo data between the servo head and the servo preamplifier and between the servo preamplifier and the tail portion. A conductive, electrically floating second ground plane is incorporated into a layer beneath the signal routing layer. An electrically insulating layer separates the signal routing layer from the second ground plane. The second ground plane underlies the area surrounding the output pins from the servo preamplifier, and extends to an area under the data head terminals of the data preamplifier.

DETAILED DESCRIPTION OF THE PREFERRED EMBODIMENTS

Figure 1:
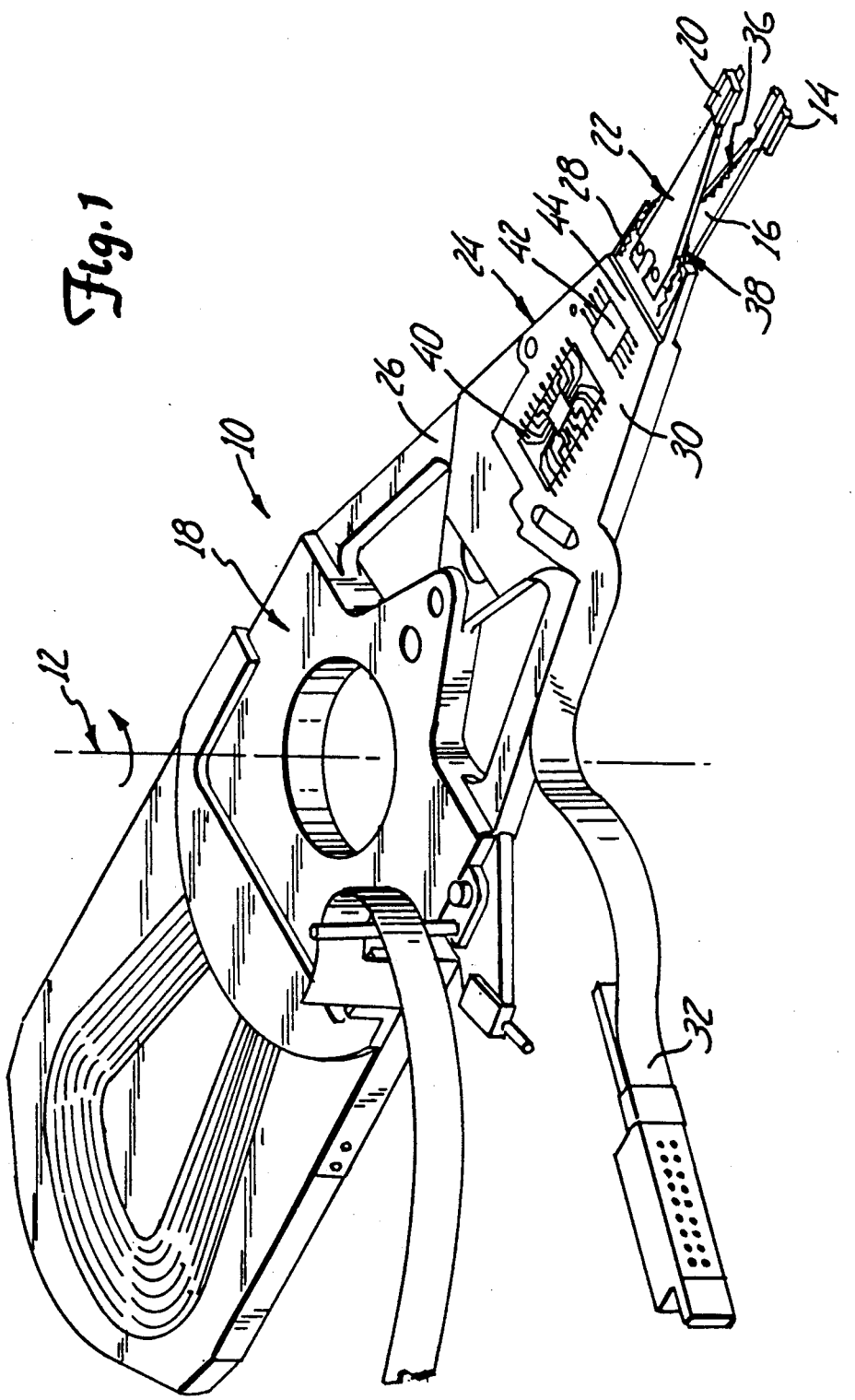
FIG. 1 is a perspective view showing the preferred embodiment of the flexible circuit mounted onto an actuator arm assembly.

FIG. 1 shows an actuator arm assembly 10 of a multi-disk magnetic disk drive. Actuator arm assembly 10 is one of several actuator arms which are mounted onto a common shaft to rotate about an axis 12. A servo motor (not shown) moves actuator arm assembly 10 (and the other arms) in unison to a selected position in response to signals provided by a servo controller. Actuator arm assembly 10 is movable in a space between a servo surface and a data surface in a disk stack, and carries both a data head 14 and a servo head 20.

Data head 14 is mounted onto a first suspension assembly 16, which includes a flex arm and a gimbal mount. First suspension assembly 16 is mounted onto the distal end of actuator arm 18 and supports data head 14 at its distal end.

Servo head 20 is mounted onto a similar second suspension assembly 22, which is also mounted onto the distal end of the actuator arm 18. Because the servo head 20 and data head 14 are each mounted on the same actuator arm 18, servo head 20 moves in unison with the data head 14.

The servo head 20 has a transducer which reads servo track information from a servo surface. This servo track information provides the servo controller (not shown) with information on the location of the servo head with respect to the disk. The information is fed to the servo controller and is used to control the movement of servo head 20 from track to track during a seek operation and to control the position of servo head 20 along the selected servo track during data read and write operations. Because the servo head 20 moves in unison with all of the data heads in the disk drive, servo head 20 effectively steers all of the data heads in the hard disk storage device.

FIG. 1 shows flexible circuit 24 mounted on actuator arm 18. Flexible circuit 24 has a main body portion 30 and a tail portion 32. A portion of the lower surface of main body portion 30 in the preferred embodiment is adhesively bonded to an upper surface 26 of the actuator arm 18, near distal end 28 of actuator arm 18.

Mounting flexible circuit 24 near the distal end 28 of the actuator arm 18 minimizes the length of data head connecting wires 36 and servo head connecting wires 38, which connect data head 14 and servo head 20, respectively, to flexible circuit 24.

Flexible circuit 24 of the present invention has a data preamplifier 40 mounted on the central portion of the main body portion 30, and a servo preamplifier 42 mounted near distal end 44 of main body portion 30.

Actuator arm assembly 10 is positionable between a pair of disks (not shown) so that servo head 20 is adjacent a servo surface and data head 14 is adjacent a data surface. Placing the servo head 20 on the same actuator arm 18 which supports the data head 14 can result in signal distortions in the servo signals, i.e. the signals which are generated by the servo head and which are sent to the servo preamplifier, are amplified, and are sent to the servo controller. For this reason, the present invention incorporates several design features into the flexible circuit which minimize this distortion.

Figure 2:
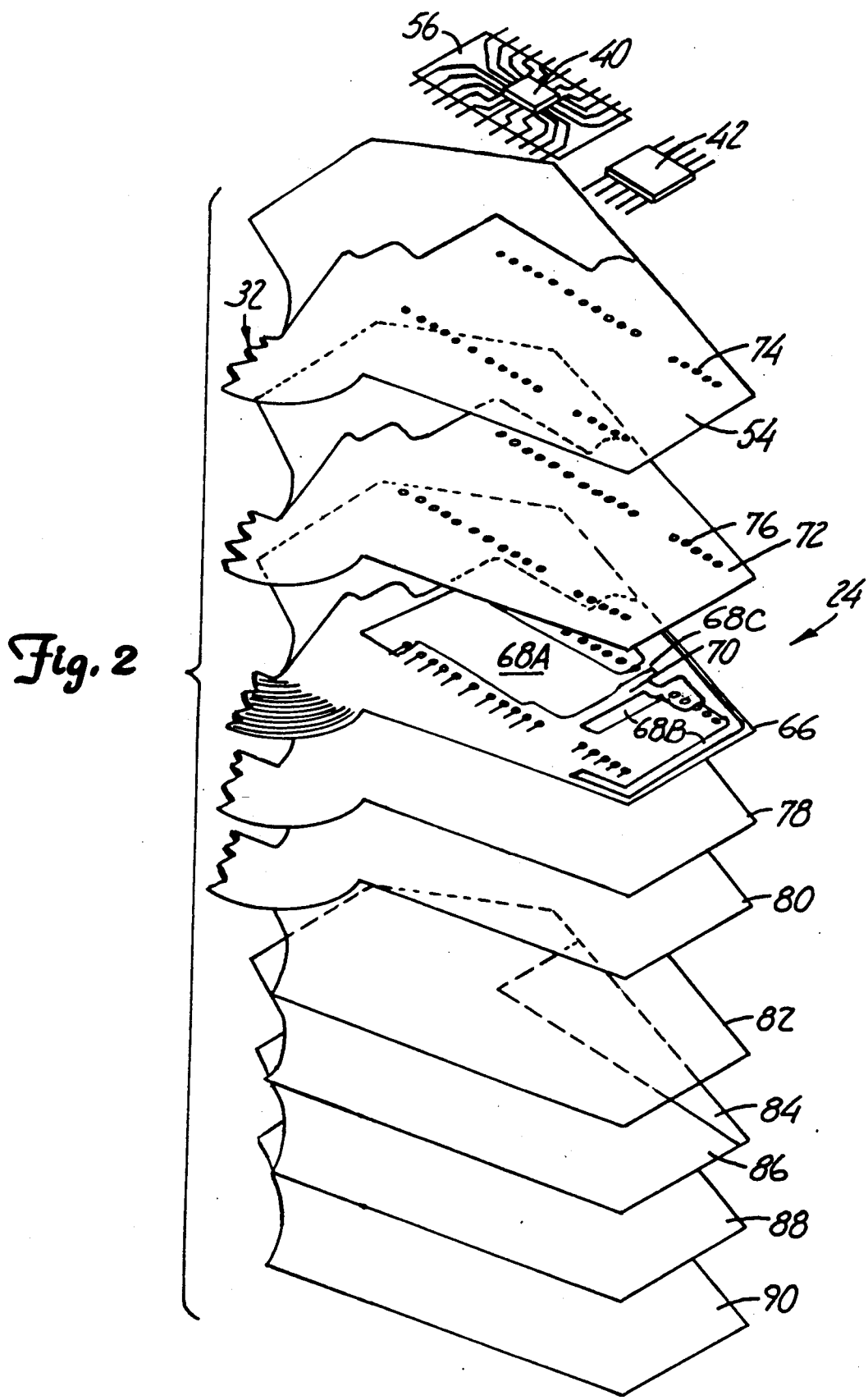
FIG. 2 is an exploded perspective view of the main body portion of the flexible circuit showing the placement of the servo preamplifier, data preamplifier, signal routing layer, second ground plane layer and electrically insulating layers.

FIG. 2 is an exploded perspective view of the main body portion 30 of flexible circuit 24. In the preferred embodiment, flexible circuit 24 has a multilayered structure having electrically insulating polyimide Kapton layers which are substantially transparent and are flexible. Data preamplifier 40 is mounted on an upper layer 54, which in the preferred embodiment is Kapton plastic. "Kapton" is a trademark for a polyimide product manufactured by the E.I. DuPont de Nemours Company of Wilmington, Del. Note that the "TAB" (Tape Automated Bonding) packaged data preamplifier 40 has its own separate layer 56 of Kapton, but this layer 56 is part of the preamp package (TAB). Servo preamplifier 42 is mounted on upper layer 54 of flexible circuit 24 between data preamplifier 40 and distal end 44 of the main body of the flexible circuit of the present invention (as shown in FIG. 1). Neither preamplifier 40, 42 is attached to flex circuit 24 by an adhesive layer. Rather, the preamplifier packages are simply soldered to flex circuit 24, the data preamplifier 40 is a "TAB" package. The servo preamplifier 42 is a "ceramic flatpak" package.

Data preamplifier 40 and servo preamplifier 42 are electrically connected to data/servo lines 100A-100S which extend from tail portion 3 in signal routing layer 66 to preamplifiers 40 and 42. These lines 100A-100S are shown in further detail in FIG. 3, and will be discussed later.

A first ground plane 68 is also contained in signal routing layer 66. First ground plane 68 is formed from one ounce rolled copper and has a notch 70 which divides the ground plane 68 into two partially isolated portions 68A and 68B, with an intermediate connecting segment 68C. Portion 68A underlies data preamplifier 40, and portion 68B underlies servo preamplifier 42. Notch 70 is located between servo preamplifier 42 and data preamplifier 40. Ground plane 68 reduces noise and crosstalk between the data and servo signals. Ground plane 68 is also electrically connected to the ground pins of the data preamplifier 40 and the servo preamplifier 42, and is connected to conductive pads at the end of tail portion 32.

Between the signal routing layer 66 and the upper layer 54 of the flexible circuit 24 is an adhesive layer 72. Electrical connections are made from the preamplifiers 40 and 42 through the upper layer 54 and adhesive layer 72 via a plurality of apertures 74 and 76, respectively.

Beneath signal routing layer 66 is a layer of adhesive 78 for encapsulating signal routing layer 66. Adhesive layer 78 is provided to bond a second polyimide Kapton layer 80 to the signal routing layer 66. Beneath this Kapton layer 80 is a third adhesive layer 82. Adhesively bonded to third adhesive layer 82 is a second ground plane layer 86 containing floating second ground plane 84 of the present invention. Surrounding the second ground plane 84 is adhesive. Beneath the second ground plane 84 is a fourth adhesive layer BB. Layer 86 is bonded by adhesive layer 88 to bottom layer 90 of flexible circuit 24. Bottom layer 90 is made from Kapton. It can be seen from FIG. 2 that second ground plane 84 is electrically isolated from the signal routing layer 66 by layers 78, 80, 82 and 86, and that second ground plane 84 is therefore electrically "floating".

The adhesive layers 72, 78, 82, 86 and 88 in the preferred embodiment of the flexible circuit are formed of a flexible adhesive bonding film such as an acrylic film. Any adhesive suitable for use in forming electric circuits is acceptable, however. Each Kapton layer is about 0.0010 inches plus or minus 0.0003 inches thick. Although the preferred embodiment uses Kapton as the electrically isolating layers, any light weight flexible synthetic material capable of accepting an adhesive and which effectively separates conductive layers is suitable. Although the precise thickness of each adhesive layer is not critical, the preferred multilayer substrate as shown in FIG. 2 has a total thickness of about 0.008 inches. This is the maximum desired thickness. Any thickness exceeding this amount forms a substrate which is too heavy, and interferes with the aerodynamic design of the actuator arm.

Second ground plane 84 in the preferred embodiment is formed from copper which is rolled, annealed and treated for bond enhancement. The thickness of the preferred second ground plane 84 is about 0.00140 inches plus or minus 0.00014 inches thick.

Figure 3:
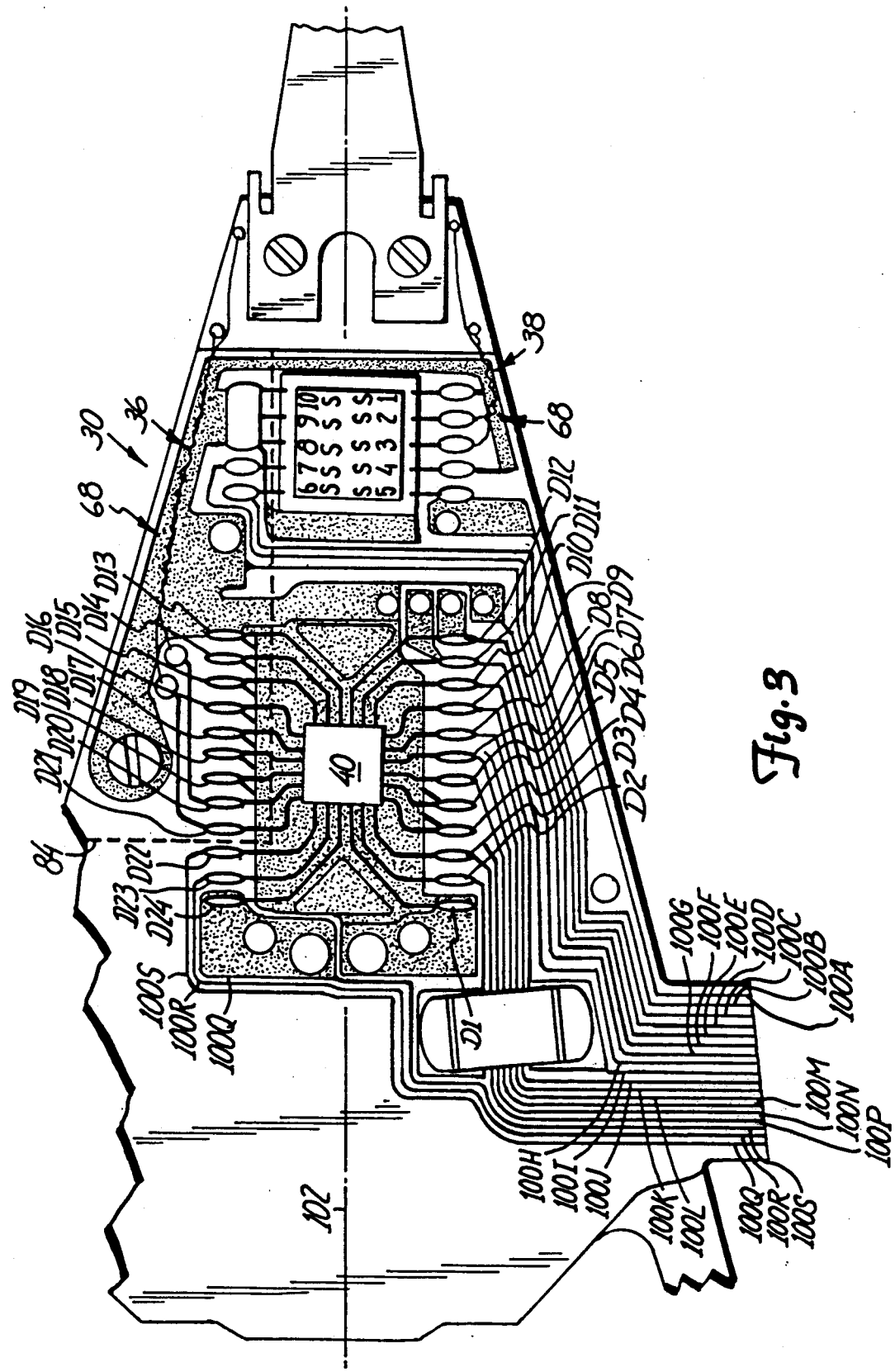
FIG. 3 is a top plan view of the preamplifier mounting portion of the main body portion of the flexible circuit of the present invention.

FIG. 3 is a top plan view of the flexible circuit of the present invention, showing main body portion 30, and the beginning of tail portion 32. Extending through tail portion 32 and main body portion 30 in layer 66 are eighteen electrical conductors which are labelled 100A-100N and 100P-100S.

The conductors and their corresponding functions are listed in the following table.

TABLE 1

| CONDUCTORS | FUNCTION | |
|---|---|---|
| 100A | Supply Voltage-Servo Preamp | (VEE2) |
| 100B | Servo Output | (OUT1) |
| 100C | Servo Output | (OUT2) |
| 100D | Ground | (GND) |
| 100E | Ground | (GND) |
| 100F | Read Data | (−RD) |
| 100G | Read Data | (+RD) |
| 100H | Supply Voltage | (VCC) |
| 100I | Current Monitor | (IMF) |
| 100J | Write OK | (−WOK) |
| 100K | GND Not connected on "main body" end | WRT Data Shield |
| 100L | Write Data | (+WD) |
| 100M | Write Data | (−WD) |
| 100N | GND Not connected on "main body" end | WRT Data Shield |
| 100P | Write Select Verify | (WSV) |
| 100Q | Negative Supply | (VEE) |
| 100R | Chip Select | ($\overline{CS}$) |
| 100S | Read/Write Select | (R/W) |

As shown in FIG. 3, data preamplifier 40 and servo preamplifier 42 are mounted along a generally longitudinal central axis 102 with servo preamplifier 42 being located toward the distal end of main body portion 30 (i.e., the end closest to data head 14 and servo head 20).

In a preferred embodiment of the present invention, data preamplifier 40 is a VTC 214 preamplifier packaged in a TAB package from VTC Incorporated of Bloomington, Minn. Servo preamplifier 42 is preferably a VTC 116, or alternatively a VM 216 preamplifier from VTC Incorporated.

In the preferred embodiment, servo preamplifier 42 has a total of 10 pins (or terminals) designated as pins S1-S10. Pins S1, S4, S8, S9 and S10 are connected to first plane ground. Pins S2 and S3 are connected to a pair of wires 38 which extend to the servo head 20. Pins S2 and S3 are input pins to preamplifier 42, and are connected to wires 38 to receive the servo signal from servo head 20. Pin S5 receives supply voltage VEE2 and is connected to line 100A. Pins S6 and S7 of servo preamplifier 42 are the OUT1 and OUT2 outputs which are supplied through lines 100B and 100C.

Data preamplifier 40 has a total of twenty-four pins which are labelled D1-D24. For convenience, the contact pads for data preamplifier 40 are labelled with the corresponding pin numbers. The following table describes the functions of the various pins of data preamplifier 40.

TABLE 2

| PIN NO. | DESCRIPTION |
|---|---|
| D1 | Ground |
| D2 | External resistor (REXT) |
| D3 | Right select verify (WSV) |
| D4 | Head select (HS1) |
| D5 | Head select (HS2) |
| D6 | Write data (−WD) |
| D7 | Write data (+WD) |
| D8 | Write OK (−WOK) |
| D9 | Current Monitor (IMF) |
| D10 | Positive supply voltage (VCC) |
| D11 | Read data (+RD) |
| D12 | Read data (−RD) |
| D13 | Ground |
| D14 | Head 3 (−HD3) |
| D15 | Head 3 (+HD3) |

TABLE 2-continued

| PIN NO. | DESCRIPTION |
| --- | --- |
| D16 | Head 1 (−HD1) |
| D17 | Head 1 (+HD1) |
| D18 | Head 2 (−HD2) |
| D19 | Head 2 (+HD2) |
| D20 | Head 0 (−HD0) |
| D21 | Head 0 (−HD0) |
| D22 | Read/write select (R/W) |
| D23 | Chip select (CS) |
| D24 | Negative supply (VEE) |

Data preamplifier 40 is capable of writing data to and reading data from as many as four data heads. In this particular embodiment, however, only a single data head 14 is being used. As a result, pins D4 and D5 are grounded which selects HD0 (i.e., pins D20 and D21). Pins D1 and D13–D19 are also grounded in this embodiment.

When data is to be written, the appropriate control lines are activated, and the data is supplied to data preamplifier 40 over lines 100L and 100M to input write data pins D6 and D7. The amplified write data signals are supplied by preamplifier 40 through pins D20 and D21 to a pair of wires 36 which extend to the data head 14.

During a read operation, signals are received over wires 36 at pins D20 and D21 of data preamplifier 40. The read signal is amplified and provided at the read data output pins D11 and D12 of the data preamplifier 40.

As shown in phantom in FIG. 3, floating second ground plane 84 underlies pins S6–S10 of servo preamplifier 42 as well as pins D13–D21 of data preamplifier 40. In this particular embodiment, the significance of second ground plane 84 is that it extends between the servo output terminals (pins S6 and S7) and a portion of the servo output lines 100C AND 100D connected to those pins, as well as pins D20 and D21 of data preamplifier 40 (which are the pins connected through wires 36 to data head 14). Of particular concern is crosstalk interference which can result in noise or distortion of the servo signals when write signals are being supplied to data head 14 through pins D20 and D21 of data preamplifier 40. It was found that second ground plane 84 helps to prevent crosstalk between data write signals and servo signals.

The ground lines 100D and 100E shown in FIG. 3 are connected to the notched first ground plane 68 shown in FIG. 2. As discussed previously, second ground plane 84 is located in a different layer, and is not electrically connected to any of the various ground lines or to first ground plane 68.

It is believed that noise distortion is minimized by the combination of: (1) notched first ground plane 68 which underlies preamplifiers 40 and 42, (2) the physical separation of the servo and data lines, (3) the shielded write data lines 100L and 100M, (4) the intermediate ground lines between servo and data lines, and (5) the floating second ground plane 84.

The present invention provides a low cost, reliable, easily manufactured flexible circuit that reduces crosstalk and noise that interferes with servo operation when a data head and a servo head are mounted on the same actuator arm. This invention makes possible the placement of the servo tracks on one of the interior disks in the disk stack because the noise and crosstalk between the servo signals and the data signals are reduced. This minimizes alignment problems of the servo head and the data heads while maintaining the same storage capacity as if the servo tracks were placed on one of the outer disks in the disk stack.

The use of the small floating second ground plane 84 as shown in FIGS. 2 and 3 minimizes the mass moment of inertia which provides several performance benefits. The actuator arm accelerates faster, which decreases access time. The lighter weight of the actuator arm results in lower energy consumption. This invention also allows use of standardized preamplifiers which are less expensive and are more reliable than customized parts.

Although the present invention has been described with reference to preferred embodiment, workers skilled in the art will recognize that changes may be made in form and detail without departing for the spirit and scope of the invention.

What is claimed is:

1. A flexible circuit for use in an actuator arm of a disk storage device which carries a data head and a servo head, the flexible circuit comprising:

a multilayer flexible substrate having electrically insulating layers and first and second conducting layers, the flexible substrate including a tail portion and a main body portion;

a plurality of conductive data lines formed in the first conducting layer;

a plurality of conductive servo lines formed in the first conducting layer;

a first ground plane formed in the first conducting layer;

a data preamplifier mounted on the flexible substrate, having data input, data output and control terminals connected to the data lines, and having data head terminals connected to the data head;

a servo preamplifier mounted on the flexible substrate, having servo input terminals connected to the servo head, and having servo output terminals connected to the servo lines; and an electrically conductive second ground plane formed in the second conducting layer and positioned below and extending between the servo output terminals of the servo preamplifier and the data head terminals of the data preamplifier, said second ground plane being electrically isolated from said first conducting layer.

2. The flexible circuit of claim 1 wherein the conductive data lines included are spaced apart from the conductive servo lines, and further comprising:

ground and power conductors positioned on opposite sides of the servo lines in the first conducting layer.

3. The flexible circuit of claim 2 wherein the first ground plane is connected to a part of the ground conductors.

4. The flexible circuit of claim 1 wherein the servo preamplifier and the data preamplifier have ground terminals connected to the first ground plane.

5. The flexible circuit of claim 1 wherein the first ground plane has a first portion underlying the data preamplifier and a second portion underlying the servo preamplifier with a notch therebetween which partially severs the first ground plane.

6. The flexible circuit of claim 1 wherein the data preamplifier and the servo preamplifier each have at least one ground terminal connected to the first ground plane, and the second ground plane underlies at least one ground terminal of the servo preamplifier and one ground terminal of the data preamplifier.

7. The flexible circuit of claim 6 wherein the second ground plane extends below at least a portion of one grounded conductor in electrical contact with both a servo preamplifier ground terminal and a data preamplifier ground terminal.

8. The flexible circuit of claim 1 wherein the second ground plane underlies a portion of a conductive servo line that is electrically connected to a servo output terminal.

9. The flexible circuit of claim 1 wherein the second ground plane is formed from a metal layer comprising copper.

10. The flexible circuit of claim 1 wherein the main body portion has an upper surface, a proximal end, a more narrow distal end, and a central axis extending from the proximal to the distal end, wherein the servo preamplifier is positioned on the upper surface proximate the distal end and is positioned centrally on the axis, and the data preamplifier is positioned centrally on the main body portion and centrally on the axis.

11. The flexible circuit of claim 10 wherein the main body portion has first and second tapered sides; wherein the servo output terminals and the data head terminals face the first side; wherein the second ground plane has a first substantially straight side positioned substantially parallel to the central axis, and a second tapered side which extends substantially parallel to the first tapered side of the flexible circuit.

12. The circuit of claim 1 wherein the second ground plane is positioned beneath a portion of the servo lines and a portion of the data lines.

13. The circuit of claim 1 wherein the second ground plane is substantially wedge shaped.

14. The flexible circuit of claim 1 and further comprising:
    ground lines formed in the first conducting layer on opposite sides of the data input lines; and
    a plurality of lines in the first conducting layer separating servo output lines from data input lines.

15. The flexible circuit of claim 14 wherein the plurality of lines includes a ground line connected to the first ground plane.

16. The flexible circuit of claim 15 wherein the first ground plane has a first portion underlying the data preamplifier.

17. The flexible circuit of claim 16 wherein the first ground plane has a second portion underlying the servo preamplifier.

* * * * *